(12) United States Patent
Küster

(10) Patent No.: US 6,259,604 B1
(45) Date of Patent: Jul. 10, 2001

(54) RECEIVING HOUSING

(75) Inventor: Frank Küster, Breitschneid-Mendenbach (DE)

(73) Assignee: Rittal-Werk Rudolf Loh GmbH & Co. KG, Herborn (DE)

(*) Notice: Subject to any disclaimer, the term of this patent is extended or adjusted under 35 U.S.C. 154(b) by 0 days.

(21) Appl. No.: 09/473,633

(22) Filed: Dec. 28, 1999

(30) Foreign Application Priority Data

Dec. 28, 1998 (DE) .............................................. 198 60 440

(51) Int. Cl.[7] ........................................................ G06F 1/16
(52) U.S. Cl. ............................ 361/725; 361/724; 361/726; 361/727
(58) Field of Search ...................................... 361/724–727

(56) References Cited

U.S. PATENT DOCUMENTS

| | | |
|---|---|---|
| 3,710,199 | 1/1973 | Cignoni, Jr. . |
| 5,450,272 | * 9/1995 | Van Gaal et al. .................... 361/690 |
| 5,711,144 | * 1/1998 | Pea ........................................ 59/78.1 |

FOREIGN PATENT DOCUMENTS

| | | |
|---|---|---|
| 41 01 907 A1 | 7/1992 | (DE) . |
| 94 10 617 U1 | 9/1994 | (DE) . |
| 732501 | 6/1955 | (GB) . |

* cited by examiner

Primary Examiner—Leo P. Picard
Assistant Examiner—Yean-Hsi Chang
(74) Attorney, Agent, or Firm—Pauley Petersen Kinne & Fejer

(57) ABSTRACT

A receiving housing having a framework which has vertical frame sections, a pull-out element being secured by a support to at least two vertical frame sections. The pull-out element can be pulled out at the front from the opened receiving housing. An electrical apparatus, for example the central processing unit of a computer is deposited on the pull-out element and connection cables are fed to the electrical apparatus. In order to improve the cable arrangement, a power supply chain is secured by one of its chain ends to the support and by its other chain end to the pull-out element. The power supply chain receives the connection cable.

4 Claims, 1 Drawing Sheet

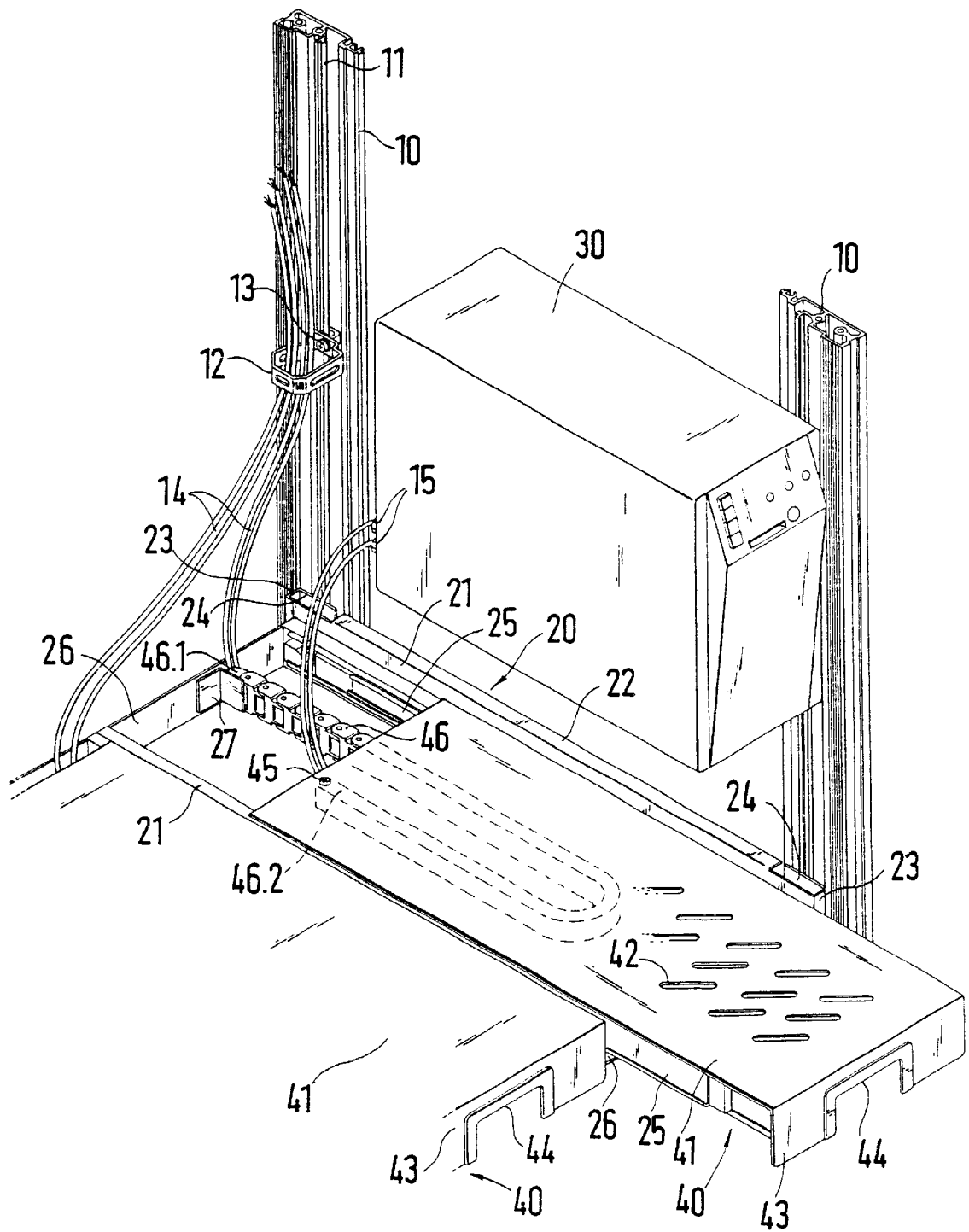

RECEIVING HOUSING

BACKGROUND OF THE INVENTION

1. Field of the Invention

This invention relates to a receiving housing having a framework which has vertical frame sections, a pull-out element secured by a support to at least two of the vertical frame sections, the pull-out element able to be pulled out at the front from the opened receiving housing, an electrical apparatus, for example a central processing unit of a computer, being deposited on the pull-out element, and connection cables being fed to the electrical apparatus.

2. Description of Prior Art

Receiving housings are known wherein connection cables are fed to the electrical apparatus via a pivoting arm mechanism. The pivoting arm mechanism has two arm parts which are connected together via a hinge with a horizontal swivel axis. One of the arm parts is connected to the pull-out element on its end facing away from the hinge. The other arm part is connected to the framework by its free end. The connection cables are fixed to the two arm parts via cable binders. In the starting position when the pull-out element is pushed in, the two arm parts are in a substantially parallel position with respect to each other. When the pull-out element is pulled out, the pivoting arm proceeds into its extended final position where the two arm parts are approximately in alignment to each other. A high parts cost results from this type of cable arrangement. In addition, the pivoting arm requires a pivot region which is then unavailable for fixing components in the interior space of the receiving housing.

SUMMARY OF THE INVENTION

One object of this invention is to provide a receiving housing of the type mentioned initially, wherein the receiving housing has a substantially simplified feeding of the connection cables to the electrical apparatus.

This object is achieved with a power supply chain secured by one of its chain ends to the support and by its other chain end to the pull-out element, and the power supply chain receives the connection cable. Power supply chains are normally used with industrial machines. The different machine assemblies are connected to the power supply chains. According to this invention, power supply chains are suitable for use in switchgear cabinets. The power supply chain needs only a very small space to perform its function and is therefore suitable for use according to this invention.

According to a preferred embodiment of this invention, the support on which the pull-out element is retained has a depth strut which extends in the direction of the housing depth and is secured to the two vertical frame sections associated with the housing side. At least one transverse tie-bar which extends in the direction of the housing breadth is coupled to the depth strut and is disposed in the region of the housing rear side, and to which transverse tie-bar the power supply chain is secured by one of its chain ends. A stable coupling of the pull-out element to the framework is possible with this embodiment of the support. The connection cable can be fed centrally to the pull-out element via the transverse tie-bar.

In particular, the transverse tie-bar extends over the entire housing breadth and at least two pull-out elements, which are disposed side by side and can be operated independently of each other, are secured to the support.

According to another embodiment of this invention, a space-conserving construction is produced when the pull-out element has a plate-shaped depositing portion, on the upper side of which the electrical apparatus is placed and on the lower side of which the power supply chain is secured and guided.

So that the power supply chain can be configured to be relatively short, a receiving housing according to this invention can be configured so that the power supply chain is secured to the region of the pull-out element by one of its chain ends. The region faces the housing rear side, and the other chain end is secured in the region of the housing rear side in a stationary manner.

In order to avoid being crushed, the connection cables should be retained in a controlled manner, away from the guiding elements in which the pull-out elements are displaceable. In order to produce this function, the connection cables have on one of their ends plug-in elements which can be inserted into complementary plug-in receiving means of the electrical apparatus. The connection cables leading from a plug-in side end are pulled into a channel surrounded by the power supply chain via the chain end of the power supply chain which is associated with the pull-out element and are guided out of the channel via the second chain end. The connection cables in the connection to the second chain end are connected to the rear side vertical frame section by means of a cable retainer.

BRIEF DESCRIPTION OF THE DRAWING

The single FIGURE is a front perspective view of a portion of a framework of a receiving housing, according to one preferred embodiment of this invention.

DESCRIPTION OF PREFERRED EMBODIMENTS

This invention is explained in more detail subsequently with reference to the embodiment, given by way of example and illustrated in the drawing. The drawing illustrates a part of a framework of a receiving housing on which a pull-out element 40 is secured. The framework has vertical frame sections 10 which have longitudinally directed securing webs 11. A support 20 can be fixed on the securing webs 11. The support 20 has two depth struts 21 which are disposed respectively on the vertical frame sections 10 which are associated with the framework side. Only one of the depth struts 21 is visible in the drawing. The depth struts 21 are manufactured as bent sheet metal components and have a vertical connecting wall from which two horizontal section sides 22 are bent over perpendicularly. The connecting wall transitions at the end side into bent-over portions 23 which project in the direction of the vertical frame sections 10. Securing portions 24 are bent over from the bent-over portions 23 and are in a parallel position relative to the connecting wall. The depth strut 21 can be secured to the securing struts 11 of the vertical frame sections 10 by means of the securing portions 24. Telescopic rails 25 are coupled to the connecting walls of both depth struts 21. Furthermore, the depth strut 21 also bears a front-end and a rear-end transverse tie-bar 26. The tie-bars 26 extend over the entire housing breadth. Two telescopic rails 21 are screwed in the center to two transverse tie-bars 26. A pull-out element 40 can be fixed to two of the telescopic rails 21, respectively. In the present embodiment, two pull-out elements 40 are fixed side by side to the support 20. Both pull-out elements 40 have the same structural configuration. Each pull-out element 40 has a horizontal depositing portion 41 from which a bent-over edge 43 is bent over at the front, perpendicularly. The bent-over edge 43 has a cut-out which serves as a handle 44. A plurality of elongated securing receiving means 42 are provided in the flat depositing portion. A central processing unit 30 can be placed on the depositing portion 41 and can be fixed to the securing receiving means 42. A power supply chain 46 is secured and guided on the underside of the depositing portion 41. The power supply chain 46 is screwed to the pull-out element 40 by one of its chain ends 46.2 (securing screw 45). The securing point of the power supply chain 46 is chosen to be in the region of the rear horizontal edge of the securing portion 41. The other chain end 46.1 of the power supply chain 46 is coupled to the rear-end transverse tie-bar 26 via a securing angle 27.

The power supply chain 46 guides and receives the connection cables 14. The connection cables 14 have on their end-side plug-in elements 15 which can be inserted into complementary plug-in receiving means of the central processing unit 30. The connection cables 14 leading from their plug-in side end through one of the chain ends 46.2 loop into a channel surrounded by the power supply chain 46. The connection cables 15 are then directed out of the channel at the other chain end 46.1. In order to be able to direct the connection cables 14 in a controlled manner from the region of the pull-out element 40, cable retainers 12 are used which can be screwed onto the securing web 11 of the rear vertical frame section 10 via a clamping piece 13.

In the inserted state of the pull-out element 40, the depositing portion 41 is guided by its rear horizontal edge until it is tight against the rear transverse tie-bar 26. The power supply chain 46 starting from the chain end 46.1 then extends in the direction of the front end handle 44. The power supply chain 46 is then deflected beneath the depositing portion 41 by 180° and extends back in the direction of the rear transverse tie-bar 26. When the pullout element 40 is pulled out, the power supply chain 46 is almost completely extended, the chain arm between the 180° deflection and the securing point of the second chain end 46.2 being only relatively short.

I claim:

1. In a receiving housing having a framework with vertical frame sections, a pull-out element secured by a support to at least two of the vertical frame sections which are parallel to each other, the pull-out element capable of being pulled out at a front from the receiving housing in an opened position, an electrical apparatus deposited on the pull-out element, and a connection cable fed to the electrical apparatus, the receiving housing comprising:

a power supply chain (46) secured by one chain end (46.1) to the support (20) in a first region of a rear side of the receiving housing and secured by an other chain end (46.2) to the pull-out element (40) in a second region of the pull-out element (40) that faces the housing rear side, and the power supply chain (46) receiving the connection cable (14);

the connection cable (14) having on a first end a plug-in element (15) which can be inserted into a complementary plug-in receiver of the electrical apparatus (30), the connection cable (14) leading from the plug-in element end into a channel surrounded by the power supply chain (46) trough the other chain end (46.2) of the power supply chain (46) which is associated with the pull-out element (40), the connection cables (14) guided out of the channel through the one chain end (46.1), and a cable retainer (12) connecting the connection cable (14) to one of vertical frame sections (10); and the support (20) having a depth strut (21) extending in a first direction of a housing depth and secured to the at least two of the vertical frame sections (10) associated with a housing side, at least one transverse tie-bar (26) extending in a second direction of a housing breadth coupled to the depth strut (21), the at least one transverse tie-bar (26) disposed in a region of a rear side of the receiving housing, and the transverse tie-bar (26) secured by the one chain end (46.1) to the power supply chain (46).

2. In the receiving housing according to claim 1, wherein the transverse tie-bar (26) extends over the housing breadth and at least two of the pull-out elements (40) which are disposed side by side and can be operated independently of each other are secured to the support (20).

3. In the receiving housing according to claim 2, wherein the pull-out element (40) has a plate-shaped depositing portion (41), on an upper side of the depositing portion (41) the electrical apparatus (30) is placed and on a lower side of the depositing portion (41) the power supply chain (46) is secured and guided.

4. In the receiving housing according to claim 1, wherein the pull-out element (40) has a plate-shaped depositing portion (41), on an upper side of the depositing portion (41) the electrical apparatus (30) is placed and on a lower side of the depositing portion (41) the power supply chain (46) is secured and guided.

* * * * *